(12) United States Patent
Mou et al.

(10) Patent No.: US 10,410,854 B2
(45) Date of Patent: Sep. 10, 2019

(54) METHOD AND DEVICE FOR REDUCING CONTAMINATION FOR RELIABLE BOND PADS

(71) Applicant: GLOBALFOUNDRIES Singapore Pte. Ltd., Singapore (SG)

(72) Inventors: Honghui Mou, Singapore (SG); Xiaodong Li, Singapore (SG); Yun Ling Tan, Singapore (SG); Alex See, Singapore (SG); Liang Li, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/857,546

(22) Filed: Dec. 28, 2017

(65) Prior Publication Data
US 2019/0206676 A1    Jul. 4, 2019

(51) Int. Cl.
*H01L 21/02* (2006.01)
*H01L 21/60* (2006.01)

(52) U.S. Cl.
CPC .... *H01L 21/02049* (2013.01); *H01L 21/0209* (2013.01); *H01L 21/02054* (2013.01); *H01L 2021/60045* (2013.01)

(58) Field of Classification Search
CPC ....... H01L 2924/00; H01L 2924/00014; H01L 2224/04042; H01L 2224/45144; H01L 2224/48463; H01L 2224/48624; H01L 2924/10253; H01L 2924/12042; H01L 2924/1306; H01L 2924/15788; H01L 2924/181; H01L 2924/30107; H01L 2224/02166; H01L 2224/05006; H01L 2224/05147; H01L 2224/05553; H01L 2224/05558; H01L 2224/05624; H01L 23/522; H01L 23/5223; H01L 23/5286; H01L 23/53238; H01L 23/53295; H01L 24/05; H01L 24/45; H01L 24/48; H01L 2924/01013; H01L 2924/01014; H01L 2924/01029; H01L 2924/10161; H01L 2924/13091; H01L 21/02049; H01L 21/02054; H01L 21/0209; H01L 2021/60045

See application file for complete search history.

(56) References Cited

U.S. PATENT DOCUMENTS

| | | | |
|---|---|---|---|
| 5,731,243 A | 3/1998 | Peng et al. | |
| 2005/0070064 A1* | 3/2005 | Edleman | H01L 21/32136 438/243 |
| 2005/0148157 A1* | 7/2005 | Kane | G01R 31/2898 438/459 |

(Continued)

*Primary Examiner* — Mohammed Shamsuzzaman
(74) *Attorney, Agent, or Firm* — Thompson Hine LLP (57) ABSTRACT

The present disclosure generally relates to methods for cleaning the backside of a wafer. A wet cleaning method may be used by stripping off the uppermost spacer layers on the backside of the wafer using a cleaning solution. In one embodiment, hydrogen fluoride (HF) solution may be employed to remove the nitride/oxide spacer layer. In another embodiment, a dry cleaning method may be employed to etch the wafer at the bevel region. Residues are completely removed from the wafer backside. This method improves the yield and storage life of the semiconductor wafers.

10 Claims, 7 Drawing Sheets

(56) References Cited

U.S. PATENT DOCUMENTS

| | | | |
|---|---|---|---|
| 2005/0205110 A1* | 9/2005 | Kao | H01J 37/32082 |
| | | | 134/1.1 |
| 2007/0075374 A1* | 4/2007 | Kudou | H01L 21/82344 |
| | | | 257/365 |
| 2008/0211008 A1* | 9/2008 | Park | H01L 21/28273 |
| | | | 257/321 |
| 2010/0167517 A1* | 7/2010 | Kirkpatrick | H01L 21/28247 |
| | | | 438/591 |
| 2013/0062777 A1* | 3/2013 | Ogata | H01L 24/05 |
| | | | 257/774 |
| 2013/0320450 A1* | 12/2013 | Hoentschel | H01L 27/0883 |
| | | | 257/368 |
| 2018/0082908 A1* | 3/2018 | Yeh | H01L 21/82384 |

* cited by examiner

METHOD AND DEVICE FOR REDUCING CONTAMINATION FOR RELIABLE BOND PADS

FIELD OF THE INVENTION

The present disclosure generally relates to semiconductor devices. More particularly, the disclosure relates to reducing bond pad fluorine contamination in devices to improve bond reliability.

BACKGROUND

Integrated circuits (IC) typically include numerous of microelectronic devices or dies formed on a single semiconductor wafer. Electrical connections between the wafer and external electrodes of a wafer package are typically made by bond wires and bond pads provided on the wafer.

For example, we have observed contamination, such as fluorine (F) contamination, on the surface of the bond pad, even with de-fluorination using oxygen/nitrogen/hydrogen positive photoresist stripper ($O_2/N_2/H_2$ PRS), especially on wafers with deep trenches which form scribe lines for dicing the wafer. Fluorine contamination leads to unreliable bonds between the bond wire and bond pad. For example, F in the bond pad may lead to breakage of the bonds. In extreme cases, excessive F may make it difficult to even form a bond between a bond wire and a bond pad. As such, F contamination may cause bond failure and result in low yields.

The present disclosure is directed to reducing F contamination in bond pads to improve bond reliability.

SUMMARY

Embodiments of the present disclosure generally relate to semiconductor devices with reduced bond pad contamination. In one embodiment, a method for forming a semiconductor wafer is disclosed. A wafer substrate having an active surface and an inactive surface is formed. Front-end-of-line (FEOL) layers are formed on the inactive surface of the wafer substrate, wherein the FEOL layers include one or more gate layers disposed on the inactive surface of the wafer substrate and an uppermost layer disposed on the gate layer. Back-end-of-line (BEOL) dielectric is formed on the active surface of the wafer substrate, wherein forming BEOL dielectric includes forming a deep trench in the BEOL dielectric, and forming a bond pad on the BEOL dielectric. A cleaning process is performed on the inactive surface of the wafer substrate, wherein the cleaning process removes at least a portion of the uppermost layer of the FEOL layers.

In another embodiment, another method for forming a semiconductor wafer is described. The method includes forming a wafer substrate having an active surface and an inactive surface. Front-end-of-line (FEOL) layers are formed on the inactive surface of the wafer substrate, wherein the FEOL layers include one or more gate layers disposed on the inactive surface of the wafer substrate and an uppermost layer disposed on the gate layer. A cleaning process is then performed on the inactive surface of the wafer substrate, wherein the cleaning process removes at least a portion of the uppermost layer of the FEOL layers.

In yet another embodiment, a device is disclosed. The device includes a wafer substrate having an active surface and an inactive surface. Back-end-of-line (BEOL) dielectric is disposed on the active surface of the wafer. A bond pad is disposed on the BEOL dielectric and a deep trench is formed in the BEOL dielectric exposing the active surface of the wafer substrate. Front-end-of-line (FEOL) layers are disposed on the inactive surface of the wafer, wherein the FEOL layers include one or more gate layers disposed on the inactive surface of the wafer, wherein the one or more gate layers contains a reduced contamination top surface.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like pails, illustrate preferred embodiments of the present disclosure and, together with the description, serve to explain the principles of various embodiments of the present disclosure.

DETAILED DESCRIPTION

Embodiments of the present disclosure generally relate semiconductor devices, such as integrated circuits (ICs), having bond pads that have reduced contamination to improve bond reliability, improving storage life. The ICs can be any type of ICs. The ICs may be incorporated into various types of electronic products, including, for example, computers, televisions, mobile phones, automobiles, as well as other products.

Figure 1:
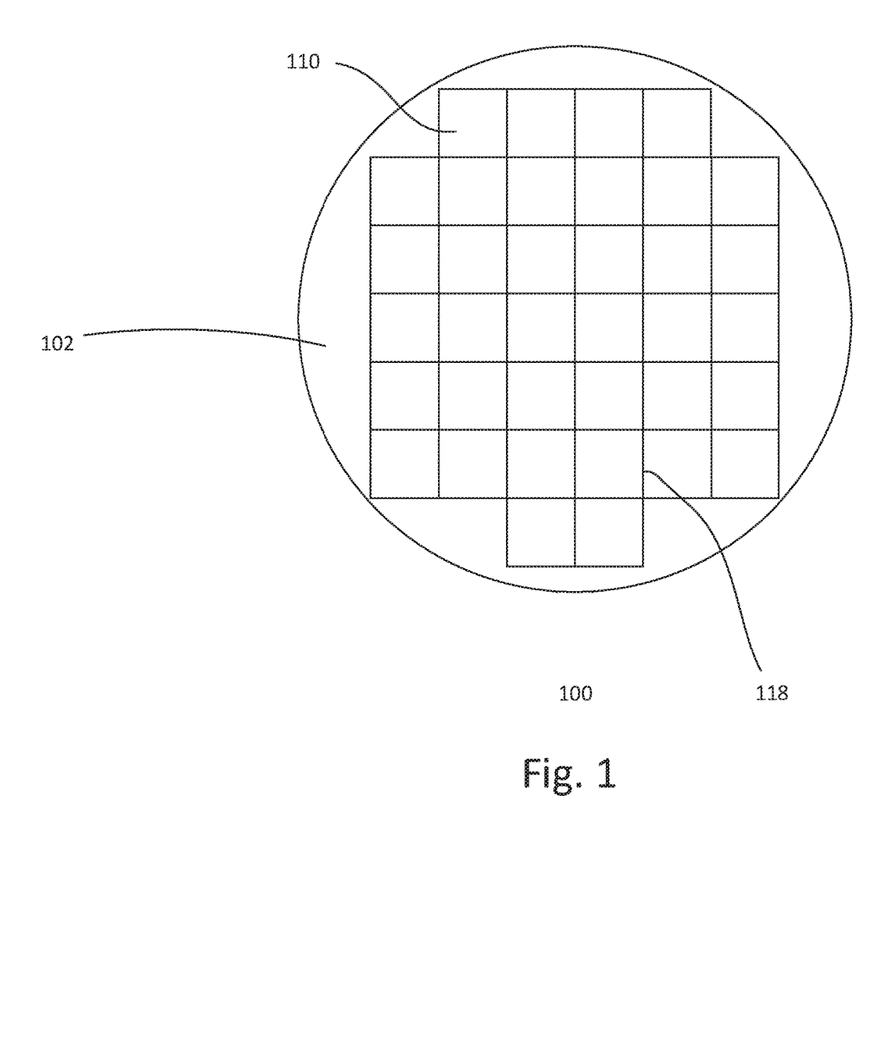
FIG. 1 shows a top view of a semiconductor wafer.

FIG. 1 shows a top view of a semiconductor wafer 100. The wafer, for example, may be a silicon substrate. Other types of wafers may also be useful. For example, the wafer may be a silicon germanium, germanium, a gallium arsenide, or a crystal-on-insulator (COI) such as silicon-on-insulator (SOI) wafer. The wafer may be a doped wafer. For example, the wafer can be lightly doped with p-type dopants. Providing a wafer with other types of dopants or dopant concentrations as well as an undoped or intrinsic wafer, may also be useful.

The wafer may be processed to form a plurality of devices or ICs 110. As shown, the ICs are rectangular-shaped or square-shaped ICs arranged in rows and columns. Since the wafer is circular in shape, the ICs are arranged to maximize the number of ICs on the wafer. Between the rows and columns of ICs is a kerf region or a scribe line 118. The kerf region or the scribe line is sufficiently wide to accommodate a wafer saw used to dice the wafer. This avoids damaging circuit components of the ICs.

To form the ICs, front-end-of-line (FEOL) processing is performed on a surface of the wafer. For example, FEOL processing is performed on the front or active surface 102 of the wafer. The FEOL processing forms circuit components, such as transistors. The FEOL processing may also form other types of circuit components, such as memory cells as well as other components. For example, FEOL processing includes forming isolation regions, such as shallow trench isolation (STI) regions and doped wells for the transistors. Various layers of gates of transistors may be formed and patterned to form gates of transistors. The gate layers may include gate dielectric and gate electrode layers. Lightly doped extension regions may be formed by ion implantation. The lightly doped extension regions are formed adjacent to first and second sides of the gate and extend under the gate. Dielectric gate sidewall spacers are formed on sidewalls on the first and second sides of the gate, followed by ion implantation to form heavily doped source/drain (S/D) regions. The S/D regions are displaced from the gate sidewalls on the first and second sides of the gate by the gate sidewall spacers. Gate sidewall spacers may be formed from a single dielectric layer or multiple dielectric layers, such as silicon oxide, silicon nitride or a combination thereof. Well contacts for biasing transistor wells may also be formed at the same time as forming the S/D regions. Other processes may include forming metal silicide contacts over the S/D regions, gates and well contacts.

In forming the transistors, various layers may also be formed on the backside of the wafer. For example, layers formed by thermal processes and by chemical vapor deposition (CVD), such as low pressure CVD (LPCVD), may be deposited on both frontside and backside of the wafer. The layers formed on both frontside and backside of the wafer may include gate dielectric, polysilicon gate electrode and dielectric spacer layers. Depending on the process, multiple gate dielectric layers, multiple gate electrode layers and/or multiple spacer layers may be formed. The gate dielectric layer may be formed using thermal oxidation while the gate electrode and spacer layers may be formed by LPCVD. The layers formed on the frontside are patterned to form the transistors while the layers on the backside are unprocessed.

After FEOL processing, back-end-of-line (BEOL) process is performed. The BEOL processing forms a BEOL dielectric having a plurality of interlevel dielectric (ILD) levels, each with a via level with via contacts and a metal level with metal lines. The various ILD levels provide interconnections for the circuit components to form the ICs. A pad level may be disposed over the top ILD level. The pad level includes contact or bond pads, such as aluminum (Al) pads, to provide external connections to the ICs. A passivation layer may be disposed over the pad level with openings to expose the contact pads. The pad level may include a redistribution layer (RDL) for positioning the bond pads as desired.

We have observed contaminants, such as fluorine (F), on the frontside of the wafer, especially on wafers with deep trenches which form scribe lines. The F contaminants on aluminum bond pads may cause die failures, thus shortening the storage life of the wafer. For example, F reacts with water molecules in the environment to form hydrogen fluoride (HF), for example, during the storage of the wafer prior to bonding. The HF reacts with aluminum oxide ($Al_2O_3$) to form aluminum fluoride ($AlF_3$) residues on the aluminum (Al) bond pads. The $AlF_3$ residues on the bond pads may cause bond failure in the dies. The failed dies are mostly located at the wafer edge.

Not to be bound by theory, it is believed that the source of F contaminants is from polymer residues sticking to the wafer backside near the bevel region, for example, during deep trench etch process of the BEOL dielectric. The F outgasses from the polymer residues on the backside of the wafer and deposits on the frontside of the wafer, for example, on the Al bond pads. Even after de-fluorination by $O_2$ ashing, F contaminants may still cause failure issues which results in low yields.

Figure 2A:
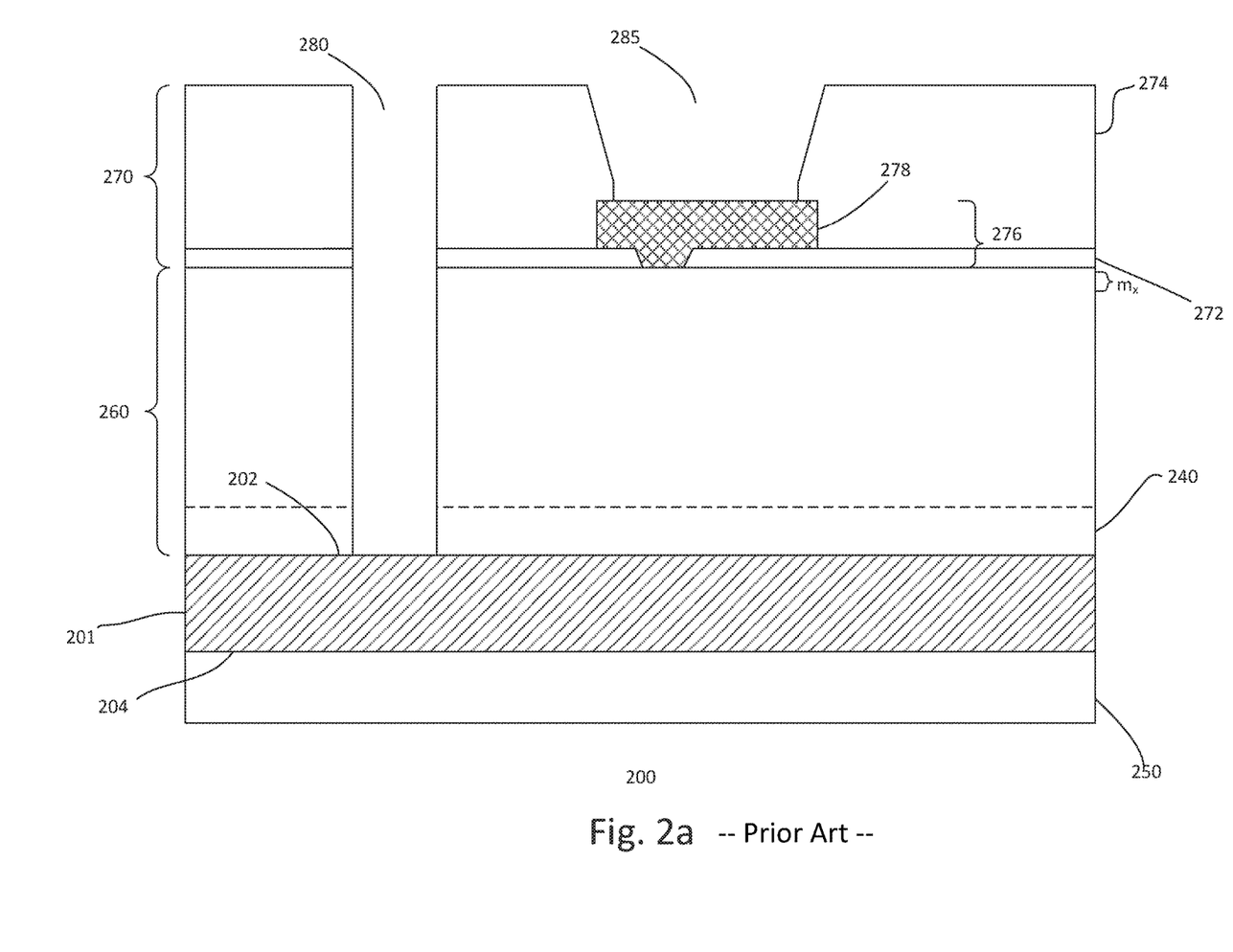
FIG. 2a shows a simplified cross-sectional view of a partially processed wafer.

FIG. 2a illustrates a simplified cross-sectional view of a portion of a partially processed semiconductor wafer 200. The partially processed wafer, as shown, includes a semiconductor wafer 201 with top and bottom surfaces 202 and 204. The top surface may be referred to as the active surface and the bottom surface may be referred to as the inactive surface. FEOL layers 240 are processed by FEOL processing to form circuit components, such as transistors, as indicated by the dotted line. Other circuit components may also be formed. For example, various layers of the transistors may be formed and patterned to form transistor gates with sidewall spacers. For example, a gate dielectric, a gate electrode and a spacer layer may be formed and patterned. The various layers may be formed by thermal oxidation, LPCVD as well as other deposition processes. Depending on the process or type of circuit components, there may be a single or multiple layers of gate dielectric, electrode and spacer layers. For example, in the case of non-volatile memory (NVM) cells, there may be two or more polysilicon electrode layers. As for the spacer layers, there may be multiple spacer layers which form a spacer stack, such as a silicon oxide and silicon nitride spacer stack.

Back-end-of-line processing forms a BEOL dielectric 260 and interconnects. The BEOL dielectric includes a plurality of interlevel dielectric (ILD) levels, each with a via level with via contacts and a metal level with metal lines. The various ILD levels provide interconnections for the circuit components to form the ICs. A pad level 270 is formed on the ILD level. The pad level may include a lower passivation layer 272 and an upper or final passivation layer 274. A contact or bond pad 278 is disposed within the passivation layer. As shown, the bond pad is disposed on the lower passivation layer and coupled to a metal line in the uppermost ILD level of the BEOL dielectric. For example, the bond pad is coupled to the metal line in the uppermost ILD level ($m_x$), where x is the number of the ILD levels. A pad via contact may be disposed in a pad via 276. The pad via contact and bond pad may be formed of Al.

To form the pad via contact and bond pad, a pad via 276 is formed in the lower passivation layer. A conductive pad layer, such as Al, is formed on the substrate by, for example, sputtering. The pad layer fills the pad via and covers the lower passivation layer. The thickness is sufficient to form a bond pad of the desired thickness. A patterning process, such as an etch using an etch mask forms the bond pad and pad via contact. The etch, for example, is a reactive ion etch (RIE). Other types of patterning processes may also be useful. The upper or final passivation layer 274 is formed on the lower passivation layer and bond pad. The upper passivation layer may be a polyimide layer. An opening 285 is formed in the upper passivation layer to expose the Al bond pad.

The FEOL processing for forming various layers of the gate may also form a FEOL layered stack 250 on the backside of the wafer. The FEOL layered stack, for example, includes layers of the transistors, such as gate dielectric, gate electrode and spacer layers. Depending on the process or type of circuit component, there may be a single or multiple layers of gate dielectric, electrode and spacer layers.

A deep trench 280 is then formed in the BEOL dielectric to form a scribe line of the wafer. In one embodiment, the deep trench exposes the surface of the substrate. Depending on the process of the deep trench etching, the deep trench may have a different depth.

Figure 2B:
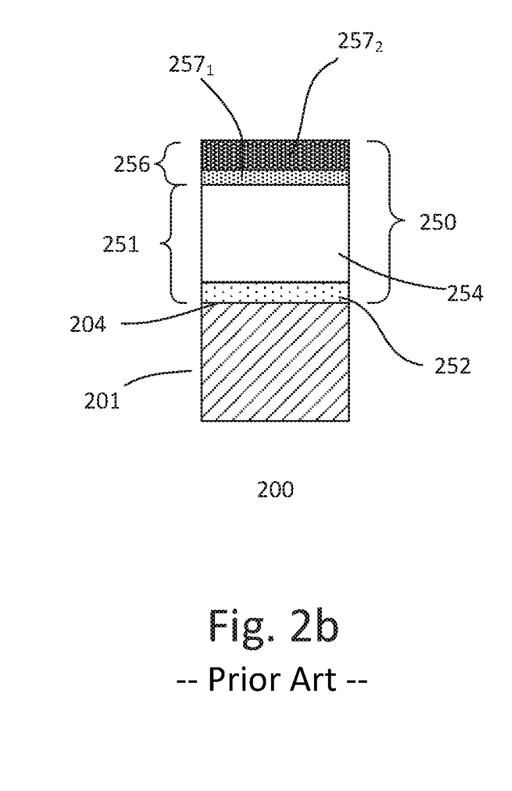
FIGS. 2b-c show exemplary embodiments of layered stacks on a backside of a processed wafer.
Figure 2C:
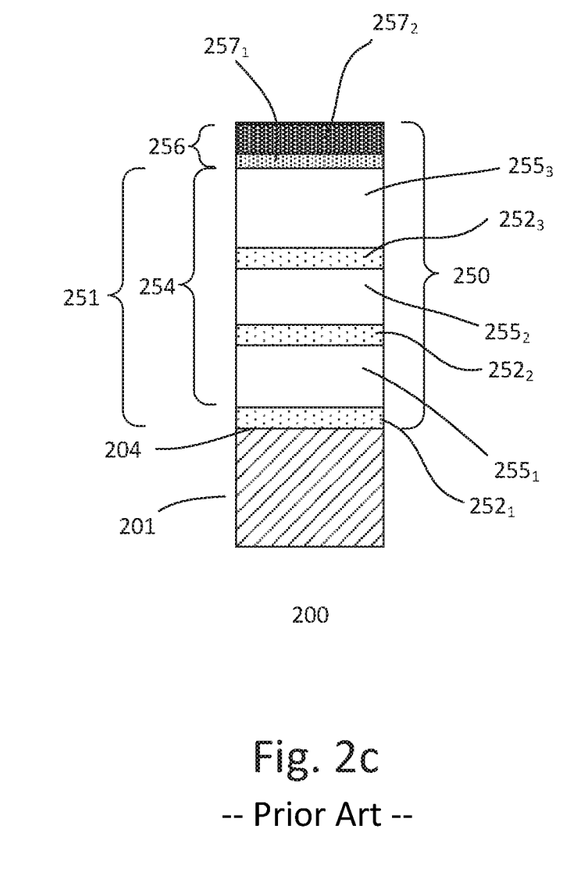

FIGS. 2b-c show different exemplary embodiments 200 of FEOL layered stacks on a partially processed wafer. Referring to FIG. 2b, a FEOL layered stack 250 is disposed on a back side 204 of a wafer 201. A FEOL layered stack, for example, includes layers of a transistor or circuit component. A FEOL layered stack may include gate layers 251 and a spacer layer 256. The gate layers, for example, include a gate dielectric layer 252, such as thermal oxide, on the back side of the wafer and a gate electrode layer 254, such as polysilicon, disposed above the gate dielectric layer. Other types or configurations of gate layers may also be useful.

As for the spacer layer 256, it is disposed over the gate layers. For example, the spacer layer is disposed on the gate electrode layer. The spacer layer may be a spacer stack having multiple dielectric spacer layer. For example, the spacer stack may include first spacer layer and second spacer layers $257_{1-2}$. The first spacer layer may be a silicon oxide layer while the second spacer layer may be a silicon nitride layer. The silicon nitride layer may be a hexachlorodisilane (HCD) nitride layer. Other types of nitride layers or spacer spacer layers or stacks may also be useful. For example, the spacer stack may include a plurality of nitride/oxide (N/O) layers, such as an N/O/N/O stack. Providing other types of transistor and spacer layers may also be useful.

Referring to FIG. 2c, the second FEOL layered stack 250 includes similar layers as the first FEOL layered stack 250. Common elements may not be described or described in detail. Unlike the FEOL layered stack of FIG. 2b, the FEOL layered stack of FIG. 2c includes a gate electrode stack 254 with a plurality of gate electrode layers. As shown, the gate electrode stack includes first, second and third gate electrode layers $255_1$, $255_2$ and $255_3$ and first, second and third gate dielectric layers $252_1$, $252_2$ and $252_3$ disposed between the gate electrode layers. The gate electrode layers may be polysilicon layers and the gate dielectric layers may be oxide layers. The multiple gate electrode layers may be various gate electrode layers of gates of a NVM cell. A spacer layer 256, such as a spacer stack with first and second spacer layers $257_{1-2}$, is disposed on the gate electrode stack 254. Other configurations of FEOL layered stacks may also be useful.

We have discovered that polymer residues are deposited on the wafer backside of the wafer. The polymer residues deposit, for example, during a deep trench etch process of the BEOL dielectric to form a scribe lines. Furthermore, we have observed that the bevel region of the wafer backside is more prone to have polymer residues. The polymer residues at the backside of the wafer are the source of contaminants which contaminate the Al bond pads. Even after de-fluorination of the bond pads by $O_2$ ashing, F contaminants are still observed at the frontside of the wafer and cause failure issues resulting in low yields.

Figure 3A:
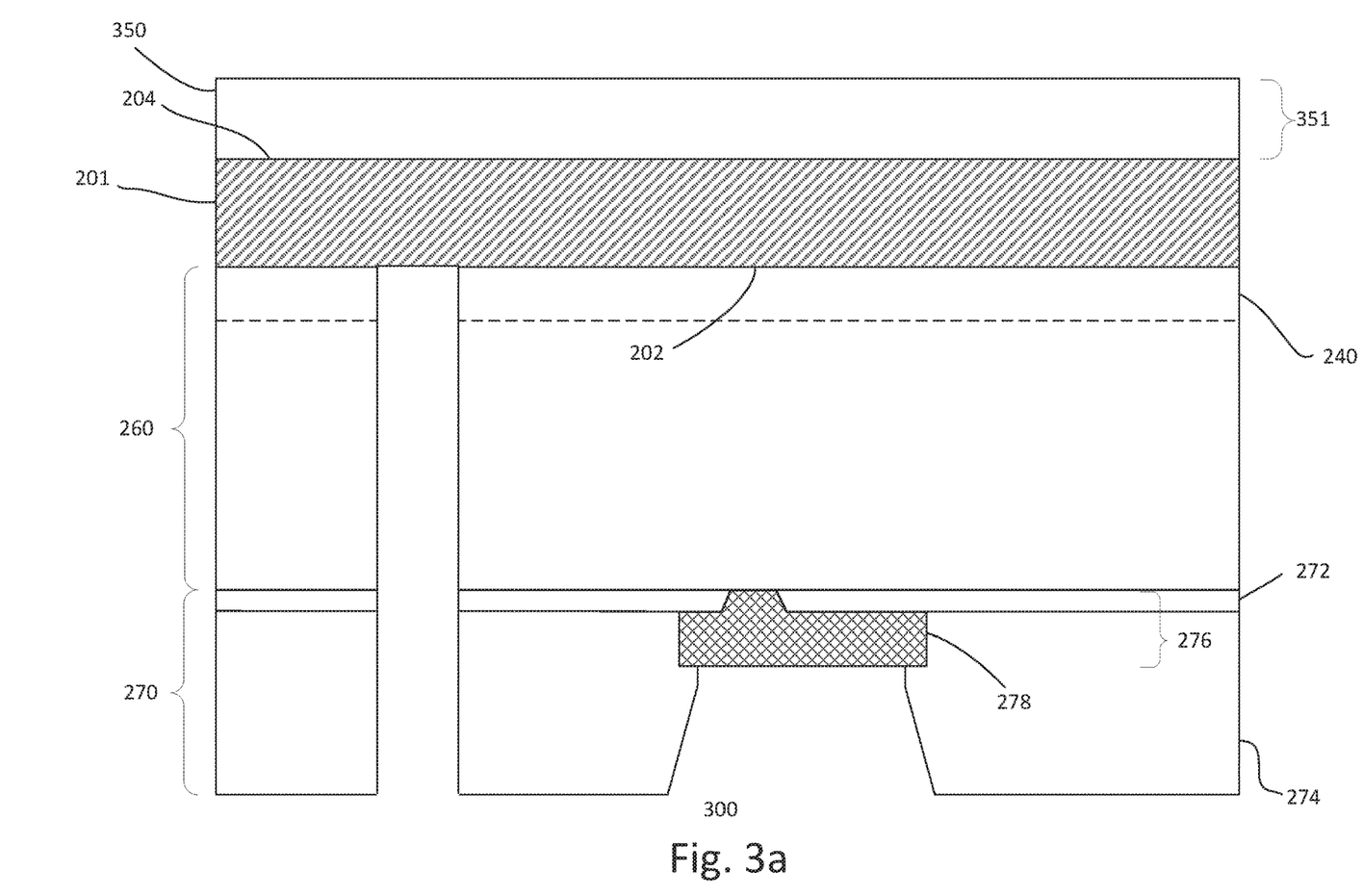
FIGS. 3a-c show simplified cross-sectional views of embodiments of a partially processed wafer with reduced pad contamination.
Figure 3B:
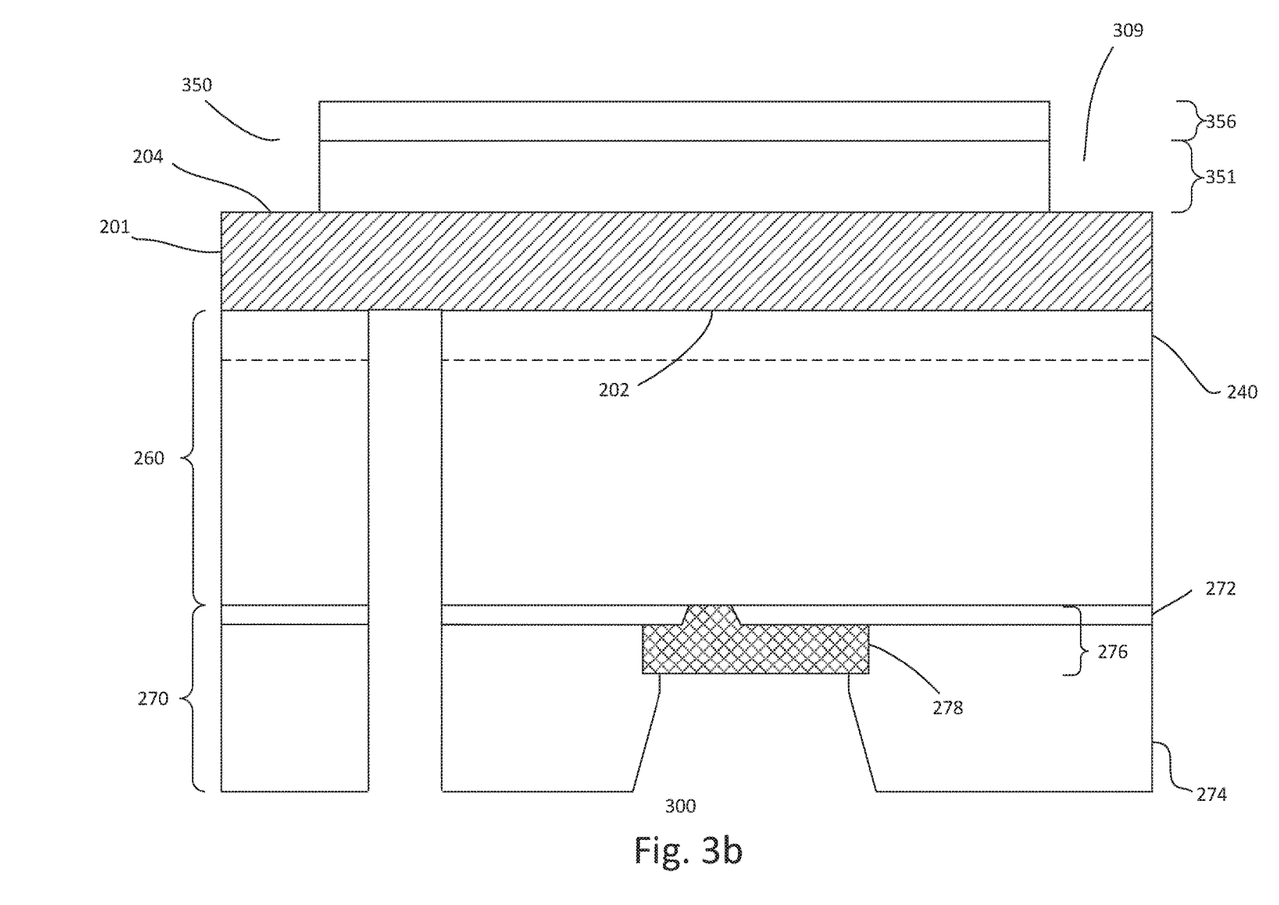
Figure 3C:
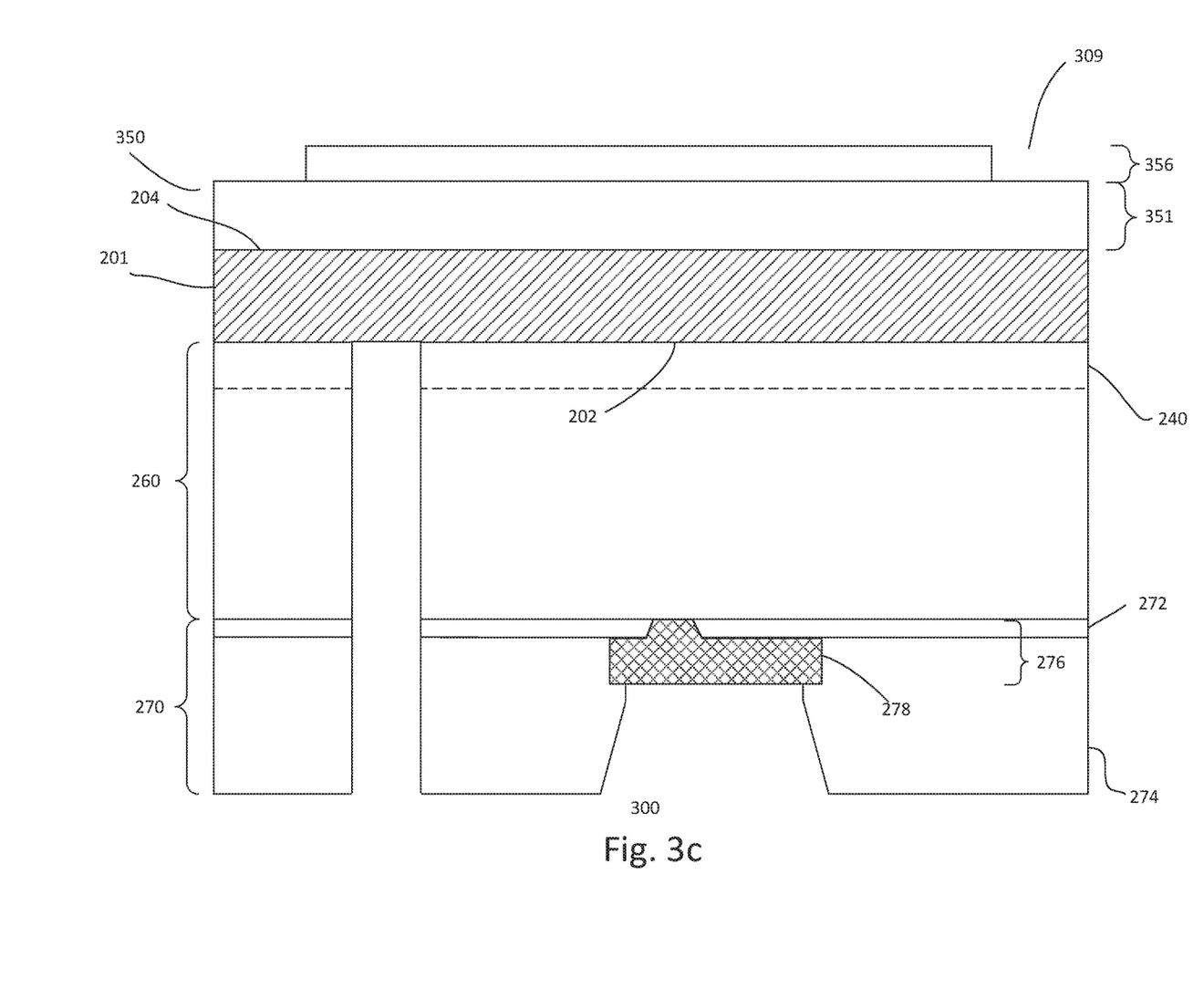

FIGS. 3a-3c show simplified cross-sectional views of embodiments of partially processed wafers 300 with reduced contamination of bond pads to improve bond reliability. The partially processed wafers are similar to the partially processed wafer of FIG. 2a. Common elements may not be described or described in detail.

Referring to FIG. 3a, a partially processed wafer 300 is processed by FEOL processing to form transistors and other circuit components on the top wafer surface 202. BEOL processing is performed to form a BEOL dielectric with a plurality of ILD levels. The various ILD levels provide interconnections for the circuit components to form the ICs. A pad level 270 is formed on the ILD level. The pad level may include a lower passivation layer 272 and an upper or final passivation layer 274. A contact or bond pad 278 is disposed within the passivation layer. As shown, the bond pad is disposed on the lower passivation layer and coupled to a metal line in the uppermost ILD level of the BEOL dielectric. A pad via contact may be disposed in a pad via 276. The pad via contact and bond pad may be formed of Al.

A bottom or backside wafer surface 204 includes a FEOL layered stack 350. The FEOL layered stack may be similar to the stacks $200_{1-2}$ described in FIG. 2b. Common elements may not be described or described in detail. In one embodiment, the backside of the wafer is processed to remove an uppermost layer of the FEOL stack. For example, the uppermost layer is a spacer layer. The spacer layer may be a spacer stack with, for example, a nitride layer disposed over an oxide layer. The nitride layer may be a HCD silicon nitride. Other types of spacer layers or spacer layer stacks may also be useful. Removing the spacer layer may be achieved using backside clean process. The backside clean process may employ a cleaning solution which has high etch selectivity for the spacer layer versus the gate electrode layer. For example, the backside cleaning solution removes the spacer layer, such as the nitride and oxide layers, with a high etch rate compared to the gate electrode layer, such as polysilicon. In one embodiment, the cleaning solution is a 49% hydrogen fluoride (HF) solution. Other types of cleaning solutions may also be useful.

In one embodiment, a protective medium may be supplied to protect the FEOL layers during the wet cleaning process. Deionized water or nitrogen gas may be used to protect the FEOL layers during the wet cleaning process. For example, deionized water or nitrogen gas may be dispensed onto the wafer through nozzles on the chuck. Other methods to protect the gate layers may also be useful.

Removing the uppermost layer also removes any polymer residues on top of it on the backside of the wafer. As discussed, the source of F contaminants is from polymer residues sticking to the wafer backside. Removing polymer residues on the backside of the wafer thus reduces F contamination to the bond pads on the frontside of the wafer.

As for the partially processed wafer of FIG. 3b, it is similar to that of FIG. 3a and FIG. 2a. Common elements will not be described or described in detail. As shown, the wafer is processed with FEOL and BEOL processes. A FEOL stack 350 is formed on a backside surface 204 of the wafer. The FEOL layered stack may be similar to the stacks described in FIG. 2b. Common elements may not be described or described in detail.

In one embodiment, the backside of the wafer is processed to remove portions of the layered stack at the bevel region 309 of the wafer by a dry cleaning process. For example, the dry cleaning process includes a bevel etch process to remove a portion of the layered stack at the bevel region of the wafer. The bevel etch, for example, may employ a mask, such as a resist mask, which is formed on the layered stack. The resist mask protects the layered stack except over the bevel region. In one embodiment, a process exclusion zone (PEZ) ring may be used to protect the layered stack. The bevel etch removes a portion of the uppermost layer and a portion of gate layers of the FEOL stack, exposing the back side surface of the wafer. In another embodiment, the bevel etch removes only a portion of the uppermost layer, exposing the gate layers of the FEOL stack, as shown in FIG. 3c. For example, the uppermost layer is a nitride/oxide layer. The etch depth may be achieved, for example, by customizing gas ratio, radio frequency (RF) power, and/or gas flow. Other methods to adjust the etch depth may also be useful. The bevel etch may be an anisotropic etch, such as a reactive ion etch (RIE). For example, the bevel etch may be a plasma bevel etch using sulfur hexafluoride (SF6) and tetrafluoromethane (CF4). Other type of etching agent may also be useful.

Removing the layered stack at the bevel region also removes any polymer residues on top of it on the backside. As discussed, the source of F contaminants is from polymer residues sticking to the wafer backside, especially the bevel region of the wafer. Removing polymer residues at the bevel region of the wafer backside thus reduces F contamination to the bond pads on the frontside of the wafer.

Figure 4:
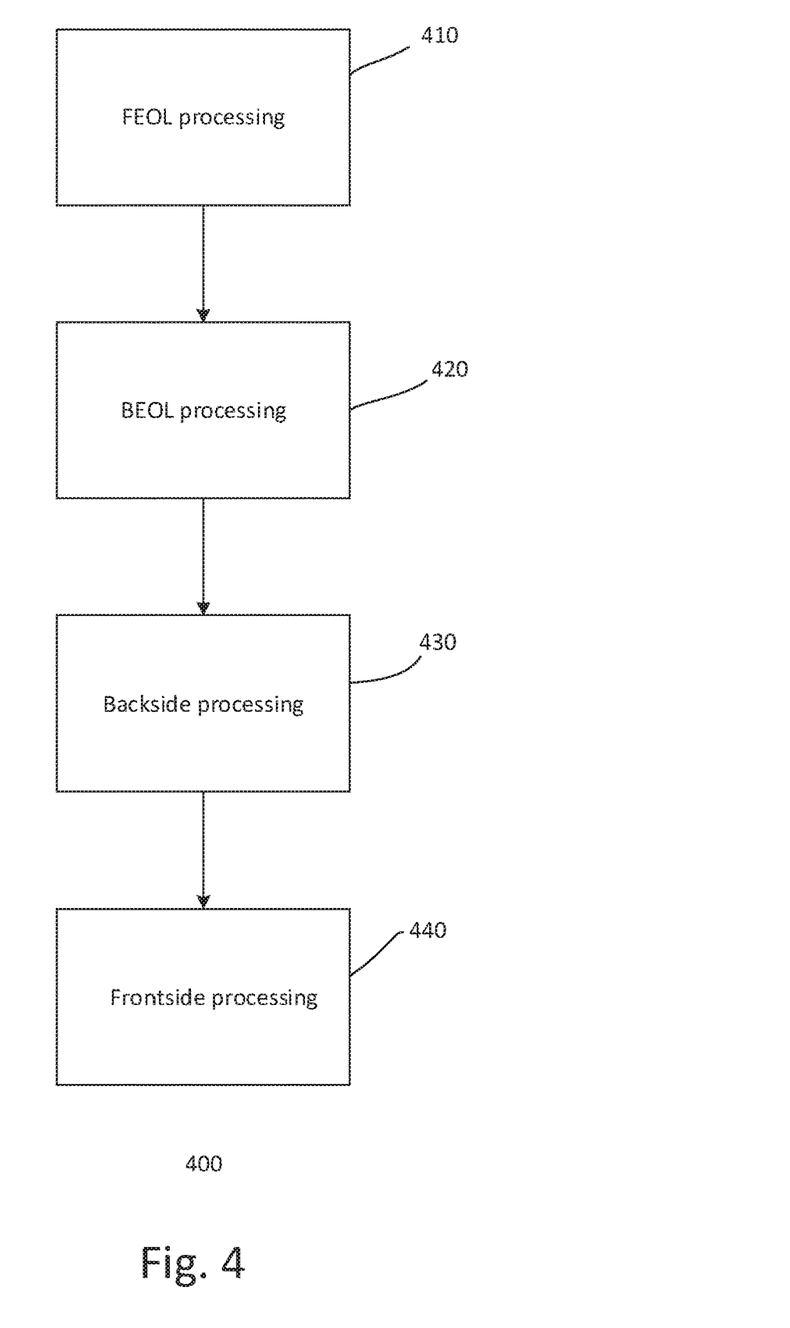
FIG. 4 shows an embodiment of a process for removing residues at a backside of a wafer.

FIG. 4 shows an embodiment of a process 400 of forming a device. A wafer, such as a silicon wafer, may be processed by FEOL processing 410 to form circuit components, such as transistors, of a plurality of devices. Forming other types of circuit components, such as NVM cells, may also be useful. After FEOL processing, BEOL processing 420 may be performed. The BEOL processing forms a BEOL dielectric which a plurality of ILD levels with metal lines and via contacts for interconnecting the circuit components. In addition, a pad level is formed over the uppermost ILD level. The pad level includes bond pads for providing external connections to the devices. The BEOL processing also includes deep trench etch to form deep trenches in the BEOL dielectric at the scribe lines.

Backside processing 430 is performed on the backside surface of the wafer. As discussed, the FEOL processing forms a FEOL layered stack on the backside surface of the wafer. The FEOL layered stack may include gate layers and an uppermost layer. The gate layer may include a gate electrode layer over a gate dielectric. In some embodiments, the gate electrode layer may be a gate electrode stack having a plurality of gate electrode layers. As for the uppermost layer, it may be a spacer layer which may be a single spacer layer or a spacer stack, such as a nitride layer over an oxide layer. Other configurations of FEOL layered stacks may also be useful.

In one embodiment, backside processing may include removing the spacer layer, leaving the gate layers on the back side of the wafer. Alternatively, backside processing may include a backside bevel etch to remove a portion of the layered stack in the bevel portion of the backside of the wafer. After backside processing, frontside processing 440 is performed. The frontside processing includes a de-fluorination step, for example a PRS, such as $O_2$ ashing. The PRS serves to de-fluorinate the bond pads. The process may continue to complete forming the device.

The embodiments as described result in various advantages. As discussed above, residues at the backside of the wafer can be removed completely. By eliminating the source of fluorine contamination, fluorine contamination on the bond pads may also be reduced. As a result, a higher yield of semiconductor chips may be achieved. Furthermore, fluorine contamination over a long storage time may also be reduced. This improves the shelf life of the semiconductor wafers. The various embodiments of the present disclosure may accommodate any dicing methods that form scribe lines using a deep trench etch process. Furthermore, the present embodiments are cost-effective.

The present disclosure may be embodied in other specific forms without departing from the spirit or essential characteristics thereof. The foregoing embodiments, therefore, are to be considered in all respects illustrative rather than limiting the present disclosure described herein. Scope of the present disclosure is thus indicated by the appended claims, rather than by the foregoing description, and all changes that come within the meaning and range of equivalency of the claims are intended to be embraced therein.

The invention claimed is:

1. A method for processing a semiconductor wafer, comprising:
    providing the semiconductor wafer that includes an active surface on a frontside of the semiconductor wafer and an inactive surface on a backside of the semiconductor wafer, wherein the active and inactive surfaces are opposite surfaces of the semiconductor wafer, and the active surface is a surface on which transistors are formed;
    forming front-end-of-line layers on the active surface and the inactive surface of the semiconductor wafer, wherein the front-end-of-line layers include one or more gate layers disposed on the active surface and the inactive surface of the semiconductor wafer, and the front-end-of-line layers further include one or more front-end-of-line dielectric layers disposed on the one or more gate layers on the active surface and the inactive surface;
    patterning the one or more gate layers on the active surface of the semiconductor wafer to form gates of the transistors;
    after patterning the one or more gate layers on the active surface of the semiconductor wafer to form the gates of the transistors, forming a back-end-of-line dielectric layer over the transistors, wherein the back-end-of-line dielectric layer includes a bond pad;
    after forming the back-end-of-line dielectric layer, forming a deep trench penetrating into the back-end-of-line dielectric layer with a deep trench etching process that deposits a polymer residue on the one or more front-end-of-line dielectric layers on the inactive surface of the semiconductor wafer; and
    after forming the deep trench, performing a cleaning process on the backside of the semiconductor wafer, wherein the cleaning process removes the polymer residue and at least a portion of the one or more front-end-of-line dielectric layers from the inactive surface.

2. The method of claim 1 wherein the bond pad comprises aluminum.

3. The method of claim 1 wherein the one or more front-end-of-line dielectric layers comprise a spacer stack that includes a nitride layer.

4. The method of claim 3 wherein the spacer stack further includes an oxide layer disposed below the nitride layer.

5. The method of claim 1 wherein the cleaning process includes a wet cleaning process that uses a cleaning solution to remove the portion of the one or more front-end-of-line dielectric layers from the inactive surface.

6. The method of claim 5 wherein the cleaning solution is a hydrogen fluoride solution, and the portion of the one or more front-end-of-line dielectric layers is a portion of a nitride layer.

7. The method of claim 1 wherein the cleaning process includes a dry cleaning process that removes the portion of the one or more front-end-of-line dielectric layers from the inactive surface at a bevel region of the semiconductor wafer, and the dry cleaning process exposes the one or more gate layers on the inactive surface of the semiconductor wafer.

8. The method of claim 1 wherein the cleaning process includes a dry cleaning process that removes the portion of the one or more front-end-of-line dielectric layers from the inactive surface at a bevel region of the semiconductor wafer, and the dry cleaning process removes at least a portion of the one or more gate layers from the inactive surface of the semiconductor wafer.

9. The method of claim 1 wherein the cleaning process includes a wet cleaning process that uses a cleaning solution to completely remove the one or more front-end-of-line dielectric layers from the inactive surface and expose the one or more gate layers on the inactive surface.

10. The method of claim 4 wherein the cleaning process includes a wet cleaning process that uses a cleaning solution to completely remove the one or more front-end-of-line dielectric layers from the inactive surface and expose the one or more gate layers on the inactive surface.

* * * * *